United States Patent [19]

Henzler

[11] Patent Number: 4,639,602
[45] Date of Patent: Jan. 27, 1987

[54] SYSTEM FOR DEFLECTING A BEAM OF CHARGED PARTICLES

[75] Inventor: Martin Henzler, Garbsen, Fed. Rep. of Germany

[73] Assignee: Leybold-Heraeus GmbH, Cologne, Fed. Rep. of Germany

[21] Appl. No.: 699,046

[22] Filed: Feb. 7, 1985

[30] Foreign Application Priority Data

Feb. 18, 1984 [EP] European Pat. Off. ........... 84101691

[51] Int. Cl.$^4$ ............................ G21K 1/08; H01J 3/14
[52] U.S. Cl. ................................................ 250/396 R
[58] Field of Search ........... 250/396 R, 292, 396 ML; 313/361.1

[56] References Cited

U.S. PATENT DOCUMENTS 2,919,381 12/1959 Glaser ............................. 250/396 R
4,393,308 7/1983 Anger et al. ..................... 250/396 R

OTHER PUBLICATIONS

Advances in Image Pickup and Display, B. Kazan, Ed., vol. 1, pp. 196–203, (1974).
A Practical Focus–Deflection System for Shaped Electron Beams, T. Soma, Optik, vol. 53, No. 4, pp. 281–284 (1979).
Preliminary Study for the Construction of a Low–Energy Electron–Diffraction Apparatus Using a High–-Tension Source, C. Berger et al, J. Appl. Phys., Dec., 1977, pp. 5027–5032.
Epitaxy of Si(111) as Studied with a New High Resolving Leed System, K. D. Gronwald et al, Surface Science 117 (1982), pp. 180–187.
Ion Optics of Ion Microprobe Instruments, H. Liebl, Vacuum, vol. 33, No. 9, (1983), pp. 525–531.

Primary Examiner—Bruce C. Anderson
Attorney, Agent, or Firm—Felfe & Lynch

[57] ABSTRACT

The invention relates to a system for the deflection of a beam of charged particles, which deflects a particle beam entering at any point into the deflection system such that it impinges upon the entrance orifice of a detector disposed at the exit from the deflection system. The deflection system comprises eight rotationally symmetrically disposed deflection plates and preferably includes two sections in order to achive a large range of uniform field strength in the deflection and a perpendicular impingement of the beam on the detector orifice.

4 Claims, 3 Drawing Figure

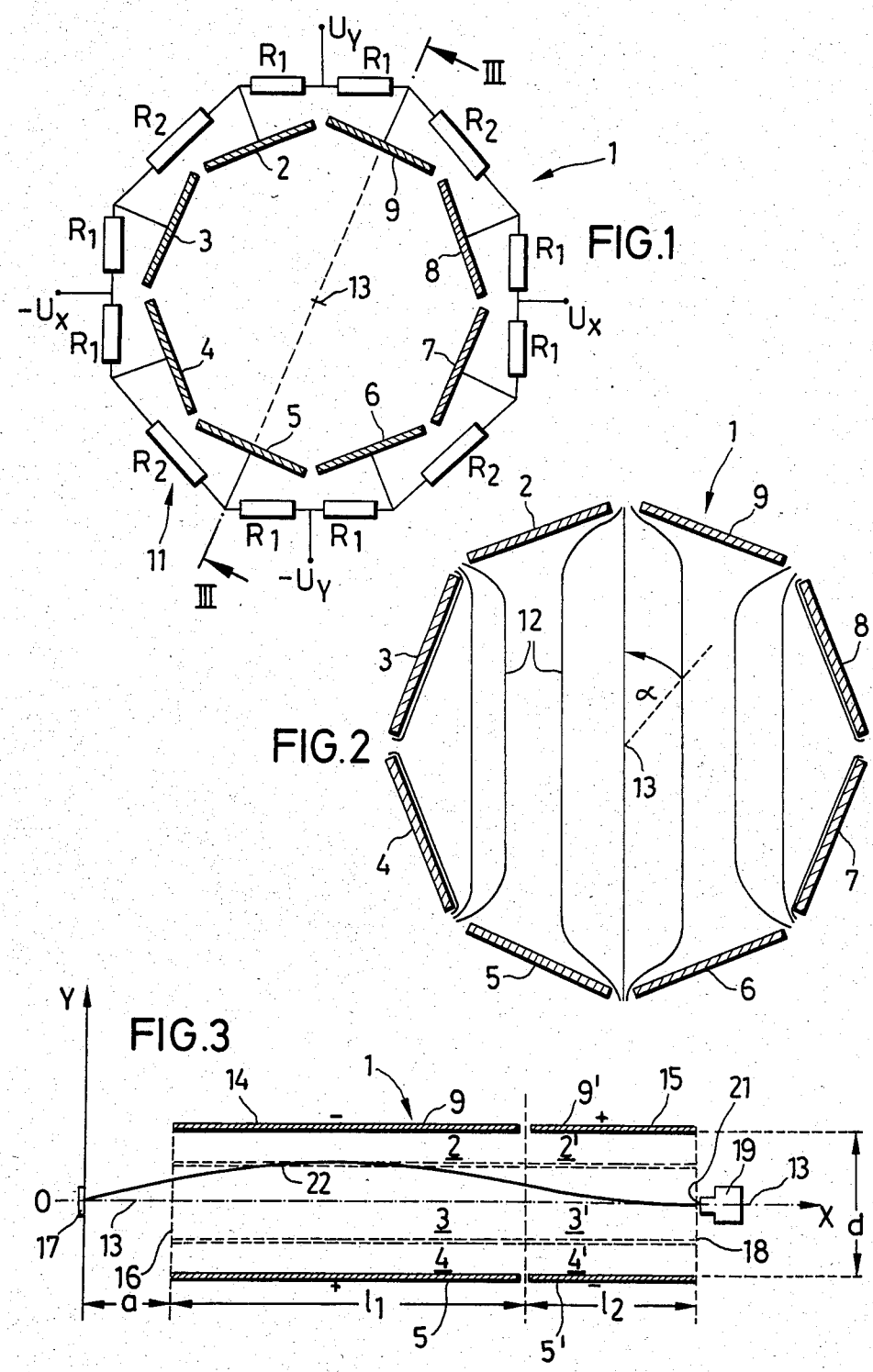

SYSTEM FOR DEFLECTING A BEAM OF CHARGED PARTICLES

This invention relates to a system for deflecting a beam of charged particles, having a plurality of rotationally symmetrically disposed deflection plates surrounding the beam.

Systems of this kind serve, for example, for studying crystal surfaces by the so-called LEED (low energy electron diffraction) technique. In this process the crystal surface is bombarded with low-energy electrons (20 to 500 eV). On the structures of the crystal surface diffraction phenomena occur which result in scattering in preferred directions. These preferred directions can be determined by measuring the angular distribution of the scattered electrons. Another method consists in making the scattered electrons visible by means of a phosphor screen. In the case of a regular structure of the crystal surface, regular diffraction images are formed, which are composed of individual diffraction reflexes. In the case of deviations from the regularity, defects of the surface structure are involved. The deflection system makes possible a precise measurement of the angular distribution of the electrons scattered from the sample without the need for a mechanical movement of the crystal or of the detector.

The system can be used likewise for photoemission measurements, in which the angle-related emission supplies important information, for example on the band structure of the crystals. The apparatus available heretofore require a moving detector.

For the measurement of angular distribution, it is known to use deflection systems which can consist either of four deflection plates (cf. Surface Science, 117, 1982, 180-187) or eight rods (cf. Vacuum, 9, 1983, 525 to 531). The plates or rods are supplied with voltages such that, in the chamber surrounded by the components, an electrical field of the greatest possible uniformity prevails, whose direction is adjustable. It is the purpose of these deflection systems to deflect particle beams which enter the deflection system at any point so that they will impinge upon the entrance orifice of a detector connected to the output of the deflection system. A disadvantage of the previously known deflection systems is the undesirable nonuniform marginal field areas which limit the usable range of entrance angles. Moreover there is the disadvantage that the detection sensitivity of the previously known deflection systems depends on the angle of the entry of the particle beam into the deflection system.

The present invention is addressed to the problem of creating a deflection system of the kind mentioned above, which is no longer encumbered by the disadvantages described.

A deflection system established in accordance with the invention is characterized by a rotationally symmetrical arrangement of eight deflection plates. In a deflection system configured in this manner, it is possible by means of a suitable resistance network to input the voltage such that an optimum large range can be achieved with a uniform field strength. Such an arrangement, in comparison with the formerly known deflection systems, permits larger deflection angles and smaller deviations from the linearity of the deflection against the deflection voltage in an apparatus of the equal size.

Advantageously, a resistance network is provided for the voltage supply, which has single resistances and dual resistances connected alternately to form an electrically closed loop or circuit. At the same time the junctions between the single resistances and the dual resistances are connected to the eight plates. The voltage supply of up to four deflection voltages is fed to the junction between the dual resistances. By the appropriate selection of these deflection voltages the direction of the uniform field can be adjusted in any desired manner, namely according to the formula:

$$\alpha = \arctan(U_y/U_x).$$

where $\alpha$ represents the angle of the field with respect to the central axis of the system. In this formula, $U_x$ and $U_y$ represent the voltages which, whether positive or negative, are applied to the junction between the dual resistances. The voltages $-U_x$ and $-U_y$ are applied to opposite junctions in each case.

According to another feature of the invention, it is desirable, in a system for the deflection of a beam of charged particles having a plurality of rotationally symmetrically arranged deflection plates surrounding the beam, to divide the length of the plates, and to select the ratio of the lengths of the sections and the voltage supply to these sections such that the beam leaves the system parallel to its axis, preferably on its axis. By this measure it can be brought about that the beam will always fall perpendicularly onto the detector. Thus, even in the case of great emission angles, i.e., in the case of a relatively great angle between the axis of the system and the beam entering the system, a constant detection sensitivity is achieved. At the same time an effective energy analysis is performed by the counterfield in the detector. The useful angular range on the crystal can be increased by these measures from 3° to 45°.

In accordance with the invention, a deflection system for a beam of charged particles, having a plurality of concentrically arranged deflection plates surrounding the beam, comprises a rotationally symmetrical arrangement of eight plates with respect to the axis of the system.

For a better understanding of the present invention, together with other and further objects thereof, reference is made to the following description, taken in connection with the accompanying drawings, and its scope will be pointed out in the appended claims.

Referring now to the drawings:

FIG. 1 is a diagrammatic view, partially in section, of an embodiment of a deflection system in accordance with the invention;

FIG. 2 is a fragmentary diagrammatic view, partially in section, to an enlarged scale, of the FIG. 1 deflection system; and FIG. 3 is a fragmentary diagrammatic view, partially in longitudinal section, of the FIG. 1 deflection system.

FIGS. 1 and 2 are diagrammatic views, partially in section, of an embodiment of the deflection system 1 in accordance with the invention. It includes eight deflection plates 2 to 9, which are disposed in a rotationally symmetrical manner such that their planes are tangential to an imaginary circle around the axis of the system.

The power supply of the deflection plates is represented in FIG. 1. It comprises a resistance network 11 having four single resistances $R_2$ alternating with four dual resistances $R_1$ in an electrically closed loop or circuit. The junctions between the single resistances $R_2$ on the one hand and the dual resistances $R_1$ on the other are connected to the deflection plates and supply the latter with the desired voltage. Between the total of four pairs of dual resistances $R_1$, the different deflection voltages, $U_x$, $U_y$ and $-U_x$ and $-U_y$, respectively, are delivered. The voltage levels can amount to as much as $\pm 150$ V. The size of the resistances can amount to several hundred thousand ohms, the equation $$R_2 = \sqrt{2} \cdot R_1$$

existing between the values of the resistances $R_1$ and $R_2$.

In FIG. 2 are represented lines of potential 12 for a particular voltage state. Except for narrow marginal areas, a uniform electrical field prevails in the deflection system 1. By varying the deflection voltages $\pm U_x$ and $\pm U_y$, this field can be rotated about the central axis 13 of the system 1. With regard to the angle $\alpha$, the formula that applies is $$\alpha = \arctan(U_y/U_x).$$

Thus it is possible to deflect beams comprising, for example, electrons entering into the uniform electrical field at various locations, such that they leave the deflection system adjacent the axis 13.

FIG. 3 shows a longitudinal section through a deflection system 1 in accordance with the invention. It comprises two sections 14 and 15 of the lengths $l_1$ and $l_2$. The distance between the entrance opening 16 of the first section 14 and the sample 17 is identified by a. d is the distance between two opposite plates of the two sections 14 and 15. Identical with the axis 13 of the system is the x-axis of a coordinate system indicated in the drawing. The sample 17 is disposed at the null point of this system. In the area of the outlet orifice 18 of the second section 15 a detector 19 is arranged such that its entrance orifice 21 lies on the axis 13. The cross-sectional representation in FIG. 3 corresponds to the line III—III represented in FIG. 1. Thus, the deflection plates 2 to 5 and 9 of the first section 14 of the bipartite deflection system 1 of FIG. 3 are visible. In the second section 15, the deflection plates 2' to 5' and 9' are likewise visible.

As an example of the working of the bipartite deflection system 1 of FIG. 3, a particle path 22 is indicated. Setting out from the sample 17, the particles enter the first section 14 at a certain angle and there they are deflected in the direction of axis 13. The voltages at the deflection plates are selected such that the place of entry into the first section 14 is approximately at the same distance from the axis 13 as the place of emergence from section 14. The deflection plates of section 15 are inversely supplied with voltages such that the particle path 2 coincides with the axis 13 in the area of the entrance orifice 21 of the detector 19.

In order to achieve this desired effect, the following condition must be at least to some extent fulfilled between the field strengths $E_1$ and $E_2$ in sections 14 and 15 and the dimensions of the sections:

$$a = \left( l_2^2 + 2l_1l_2 - \frac{E_1}{E_2} l_1^2 \right) / \left( 2l_2 - 2\frac{E_1}{E_2} l_1 \right)$$

$l_1$ is preferably twice as great as $l_2$. 16 mm has proven to be a desirable width for the deflection plates 2 to 9.

While there has been described what is at present considered to be the preferred embodiment of this invention, it will be obvious to those skilled in the art that various changes and modifications may be made therein without departing from the invention, and it is, therefore, aimed to cover all such changes and modifications as fall within the true spirit and scope of the invention.

What is claimed is:

1. A deflection system for a beam of charged particles, having a plurality of concentrically arranged deflection plates surrounding the beam, comprising:
a rotationally symmetrical arrangement of eight plates with respect to the axis of the system, the deflection plates being divided in their longitudinal direction into a plurality of longitudinally divided sections, and a voltage supply for the plates, and the ratio of deflection plate section lengths, and the voltage supply for the plates, being selected such that the beam leaves the system parallel to its axis.

2. A deflection system in accordance with claim 1, in which the length ratio and the voltage supply are selected such that the beam leaves the system on its axis.

3. A deflection system in accordance with claim 1, with a sample disposed at the distance a in front of the deflection system, in which the lengths $l_1$ and $l_2$ of the deflection plates within the longitudinally divided sections thereof at least approximately fulfill the following condition:

$$a = \left( l_2^2 + 2l_1l_2 - \frac{E_1}{E_2} l_1^2 \right) / \left( 2l_2 - 2\frac{E_1}{E_2} l_1 \right)$$

where $E_1$ and $E_2$ represent the field strengths of lengths $l_1$ and $l_2$, respectively.

4. A deflection system in accordance with claim 3, in which the length, with respect to the direction of the particle beam, of a first section 1, of the deflection plates is twice as great as the length of a second section 2 thereof.

* * * * *

UNITED STATES PATENT AND TRADEMARK OFFICE
CERTIFICATE OF CORRECTION

PATENT NO. : 4,639,602

DATED : January 27, 1987

INVENTOR(S) : Martin Henzler

It is certified that error appears in the above-identified patent and that said Letters Patent is hereby corrected as shown below:

Title page:

In the Abstract, line 8 for "achive" read -- achieve --.

Column 4, line 1 for "2" read -- 22 --.

Column 4, line 51 for "1" read -- $l_1$ --.

Column 4, line 52 for "2" read -- $l_2$ --.

Signed and Sealed this

Twenty-fourth Day of January, 1989

Attest:

DONALD J. QUIGG

Attesting Officer     Commissioner of Patents and Trademarks